United States Patent
Lu et al.

(10) Patent No.: US 11,722,140 B2
(45) Date of Patent: Aug. 8, 2023

(54) PHASE-LOCKED-LOOP CIRCUIT EMPLOYING A HYBRID LOOP FILTER WITH SAMPLE AND HOLD CAPACITORS FOR REDUCED SIGNAL JITTER, AND RELATED METHODS

(71) Applicant: Microsoft Technology Licensing, LLC, Redmond, WA (US)

(72) Inventors: Ping Lu, Cary, NC (US); Charles Boecker, Ames, IA (US); Bupesh Pandita, Cary, NC (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 17/646,700

(22) Filed: Dec. 31, 2021

(65) Prior Publication Data
US 2023/0216509 A1 Jul. 6, 2023

(51) Int. Cl.
*H03L 7/093* (2006.01)
*H03L 7/091* (2006.01)
(Continued)

(52) U.S. Cl.
CPC ............ *H03L 7/093* (2013.01); *H03L 7/0893* (2013.01); *H03L 7/091* (2013.01); *H03L 7/0992* (2013.01)

(58) Field of Classification Search
CPC ....... H03L 7/085; H03L 7/089; H03L 7/0891; H03L 7/0893; H03L 7/0896; H03L 7/091; H03L 7/093; H03L 7/0994
See application file for complete search history.

(56) References Cited

U.S. PATENT DOCUMENTS 6,384,638 B1 5/2002 Nayebi et al.
8,593,188 B2 11/2013 Palwai
(Continued)

FOREIGN PATENT DOCUMENTS

CN 112383304 B 6/2021
KR 102279315 B1 7/2021

OTHER PUBLICATIONS

Baek, et al., "A PLL with an Unipolar Charge Pump and a Loop Filter Consisting of Sample-Hold Capacitor and 2nd-Order RC Filter", In Journal of the Korea Institute of Information and Communication Engineering, vol. 17, No. 10, Oct. 2013, pp. 2380-2386.

*Primary Examiner* — Patrick O Neill
(74) *Attorney, Agent, or Firm* — Withrow & Terranova, PLLC

(57) ABSTRACT

A phase-locked loop (PLL) circuit generates an analog signal in phase-lock with a reference signal at a reference frequency. The PLL circuit includes a charge pump circuit, a loop filter circuit, a feedback divider, and a voltage controlled oscillator (VCO). The charge pump circuit charges a sample capacitor of the loop filter circuit to a sample voltage based on a phase difference between the generated analog signal and the reference signal. The loop filter circuit stores the sample voltage as a proportional control voltage in a hold capacitor to reduce or avoid ripple in the control voltage that causes jitter in the analog signal. The loop filter circuit also provides the sample voltage to an integral component circuit comprising a comparator and digital accumulator producing an integral control. The VCO generates the analog signal at a frequency based on the proportional control voltage and the integral control voltage.

21 Claims, 7 Drawing Sheets

(51) Int. Cl.
    *H03L 7/099*         (2006.01)
    *H03L 7/089*         (2006.01)

(56) References Cited

U.S. PATENT DOCUMENTS

| | | |
|---|---|---|
| 8,742,810 B2 | 6/2014 | Noguchi et al. |
| 8,803,572 B2 | 8/2014 | Kumar et al. |
| 9,559,707 B2 | 1/2017 | Luo et al. |
| 10,389,368 B1 * | 8/2019 | Wang .................. H03L 7/089 |
| 10,715,155 B1 * | 7/2020 | Parvizi .................. H03L 7/089 |
| 2002/0136342 A1 * | 9/2002 | Lee .................. H03L 7/0898 |
| | | 375/376 |
| 2011/0012652 A1 * | 1/2011 | Lamanna .............. H03L 7/093 |
| | | 327/156 |

* cited by examiner

500 ─╮

┌─────────────────────────────────────────────────────────────┐
│ CONTROL THE PLL CIRCUIT (300), THE PLL CIRCUIT (300) INCLUDING │
│ THE VOLTAGE CONTROLLED OSCILLATOR (308), THE SAMPLING │
│ CAPACITOR ($C_{SAMP}$) COMPRISING THE SAMPLE NODE (316), THE RESET │
│ CIRCUIT (328) COUPLED TO THE SAMPLE NODE (316), THE CHARGE PUMP │
│ CIRCUIT (304) COUPLED TO THE SAMPLE NODE (316), THE HOLD │
│ CAPACITOR ($C_{HOLD}$) COMPRISING THE HOLD NODE (336), WHEREIN THE │
│ PROPORTIONAL CONTROL VOLTAGE (VHOLD) IS A VOLTAGE ON THE │
│ HOLD NODE (336) COUPLED TO THE SAMPLE NODE (316) AND THE HOLD │
│ NODE (336), AND AN INTEGRAL COMPONENT CIRCUIT (310) COUPLED TO │
│ THE HOLD NODE (336), WHEREIN CONTROL THE PLL CIRCUIT (300) │
│ COMPRISES: ──── 502
│
│   ┌─────────────────────────────────────────────────────┐
│   │ CONTROL THE RESET CIRCUIT (328) TO COUPLE THE SAMPLE │
│   │ NODE (316) TO THE INTERMEDIATE SUPPLY VOLTAGE RAIL (332) │
│   └─────────────────────────────────────────────────────┘
│                          │
│                          ▼                             ── 504
│   ┌─────────────────────────────────────────────────────┐
│   │ CONTROL THE SWITCH (314) OF THE CHARGE PUMP CIRCUIT (304) │
│   │ TO COUPLE THE SAMPLE NODE (316) TO A FIRST CURRENT │
│   │ SOURCE CIRCUIT (318) COUPLED TO A REFERENCE VOLTAGE RAIL (320) │
│   └─────────────────────────────────────────────────────┘
│                          │
│                          ▼                             ── 506
│   ┌─────────────────────────────────────────────────────┐
│   │ CONTROL A SWITCH (322) OF THE CHARGE PUMP CIRCUIT (304) TO │
│   │ COUPLE THE SAMPLE NODE (316) TO A CURRENT SOURCE CIRCUIT │
│   │ (324) COUPLED TO A SUPPLY VOLTAGE RAIL (326) │
│   └─────────────────────────────────────────────────────┘
│                          │
│                          ▼                             ── 508
│   ┌─────────────────────────────────────────────────────┐
│   │ CONTROL THE HOLD SWITCH (334) TO COUPLE THE SAMPLE NODE │
│   │ (316) TO THE FIRST HOLD NODE (336) │
│   └─────────────────────────────────────────────────────┘
└─────────────────────────────────────────────────────────────┘
                           │
                           ▼
                         TO 510

FIG. 5A

PHASE-LOCKED-LOOP CIRCUIT EMPLOYING A HYBRID LOOP FILTER WITH SAMPLE AND HOLD CAPACITORS FOR REDUCED SIGNAL JITTER, AND RELATED METHODS

FIELD OF THE DISCLOSURE

The technology of the disclosure relates in general to signal generation circuits and, more particularly, to phase-locked-loops for stabilizing signal frequency.

BACKGROUND

Wireless communication is increasingly utilized in a wide variety of devices and applications beyond cellular telephones. Advancements made possible by the fifth-generation new radio (5G-NR) technology, including internet of things, bring a higher level of traffic to the range of frequencies usable for wireless transmission. Wireless communication devices also access wired networks, which provide access to the internet, for example. Signals are transmitted over both wired and wireless transmission media within predefined frequency bands that are allocated to different purposes and it is necessary for signals to be transmitted at their designated frequencies. A phase-locked-loop (PLL) circuit can be used in a transmitter of wireless or wireline signals to keep the transmitted signals at a desired frequency. To be detailed, a PLL detects a difference in phase between a reference signal and a generated signal and adjusts the generated signal to become that same frequency as the reference signal and phase-locked with the reference signal. In this regard, the PLL includes circuits to detect the phase and frequency difference and sends a corresponding control voltage to a voltage controlled-oscillator (VCO) to generate the signal based on phase/frequency comparison. The circuits performing the detection and generating the control signal can introduce unwanted variations in the control signal, and such variations have an impact on the generated signal. For example, minor variations in voltage (i.e., ripple) in the control voltage provided to the VCO can cause variations in frequency and phase (i.e., jitter), which introduces noise into the signals transmitted by the wireless device, degrading the signal to noise ratio (SNR). Thus, a PLL that minimizes jitter in the generated signal is desirable.

SUMMARY

Exemplary aspects disclosed herein include a phase-locked-loop (PLL) circuit employing a hybrid loop filter with sample and hold capacitors for reduced signal jitter. A PLL circuit generates an analog signal in phase-lock with a reference signal at a reference frequency. The PLL circuit includes a charge pump circuit, a loop filter circuit, a feedback divider, and a voltage controlled oscillator (VCO) circuit. The charge pump circuit charges/discharges a sample capacitor of the loop filter circuit to a sample voltage based on a phase difference (timing difference) between the generated analog signal and the reference signal. The loop filter circuit stores the sample voltage as a proportional control voltage in a hold capacitor to reduce or avoid ripple in the control voltage because such ripple creates undesirable frequency variations which accumulate to phase variations (i.e., jitter) in the generated analog signal. The loop filter circuit also provides the sample voltage to a digital integral component circuit that produces an integral control voltage. The VCO circuit generates the analog signal at a frequency that is based on the proportional control voltage on the hold capacitor and based on the integral control voltage from the integral component circuit. In some examples, a PLL circuit including the loop filter circuit with the hold capacitor reduces noise in signals transmitted by a wireless device. In some examples, the loop filter circuit including the hold capacitor generates a single-ended control voltage to the VCO circuit. In some examples, the loop filter circuit including the hold capacitor generates a differential control voltage to the VCO circuit.

In exemplary aspects disclosed herein, a PLL circuit is disclosed. The PLL circuit comprise a voltage controlled oscillator (VCO) circuit configured to generate an analog signal, wherein a frequency of the analog signal is based on a first control voltage and a second control voltage. The PLL circuit comprises a charge pump circuit; and a loop filter circuit comprising a first sample capacitor comprising a first sample node coupled to the charge pump circuit and a reset circuit coupled to the sample node. The loop filter circuit comprises a first hold capacitor comprising a first hold node, wherein the first control voltage comprises a voltage on the first hold node; a hold switch coupled to the first sample node and the first hold node; and a digital integral component circuit coupled to the first hold node and configured to generate the second control voltage based on the first control voltage.

In additional exemplary aspects, a method of generating an analog signal in a phase-locked loop (PLL) circuit is disclosed. The method comprises controlling the PLL circuit, the PLL circuit comprising a voltage controlled oscillator (VCO) circuit; a first sampling capacitor comprising a sample node; a reset circuit coupled to the sample node; a charge pump circuit coupled to the sample node; a first hold capacitor comprising a hold node, wherein a first control voltage comprises a voltage on the hold node; a hold switch coupled to the sample node and the hold node; and an integral component circuit coupled to the hold node. Controlling the PLL circuit comprises generating, in the integral component circuit, a second control voltage based on the first control voltage; and generating, in the VCO circuit, an analog signal having a frequency based on the first control voltage and the second control voltage.

BRIEF DESCRIPTION OF THE DRAWING FIGURES

The accompanying drawing figures incorporated in and forming a part of this specification illustrate several aspects of the disclosure, and together with the description, serve to explain the principles of the disclosure.

FIGS. 5A and 5B are a flowchart illustrating a method of operating the PLL in FIG. 3;

Figure 6:
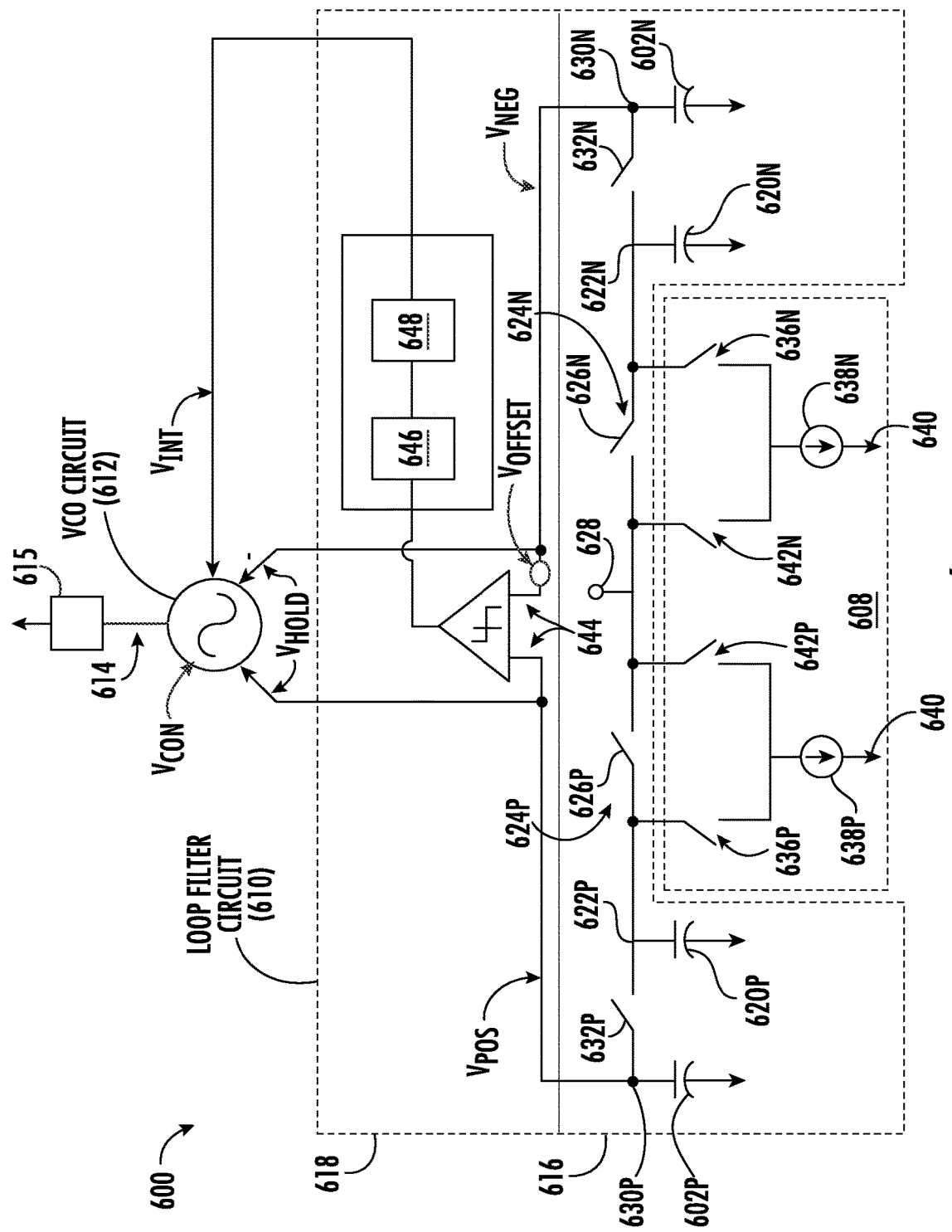
FIG. 6 is a schematic diagram of an exemplary differential PLL circuit employing positive and negative hold capacitors to provide a differential control voltage with reduced ripple to the VCO circuit.
Figure 7A:
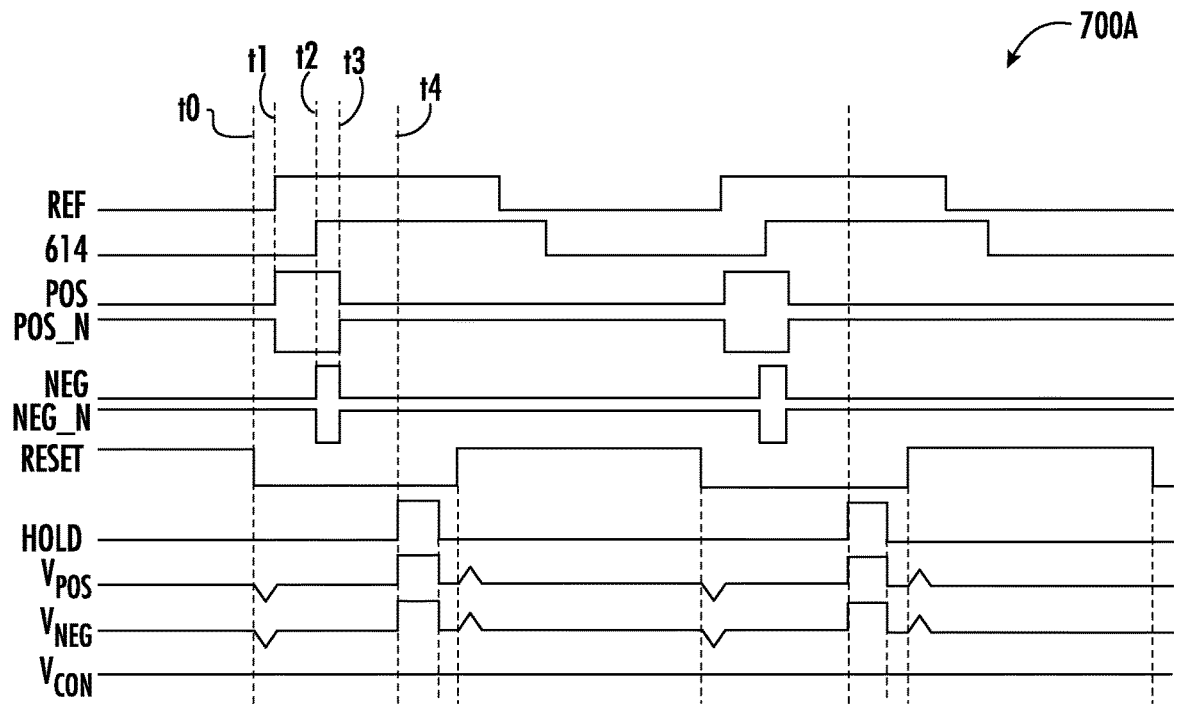
Figure 7B:
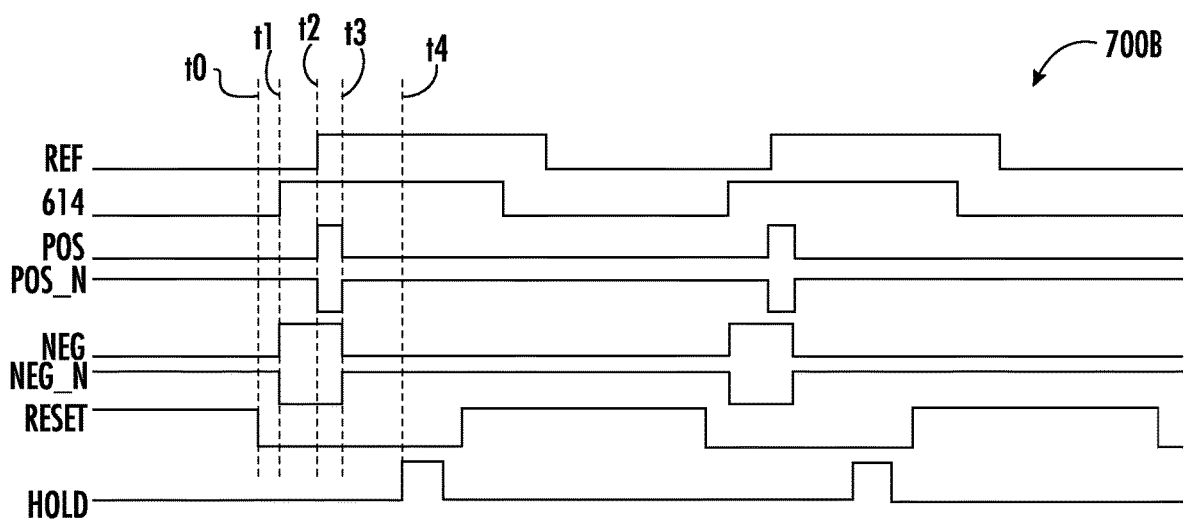
Figure 8:
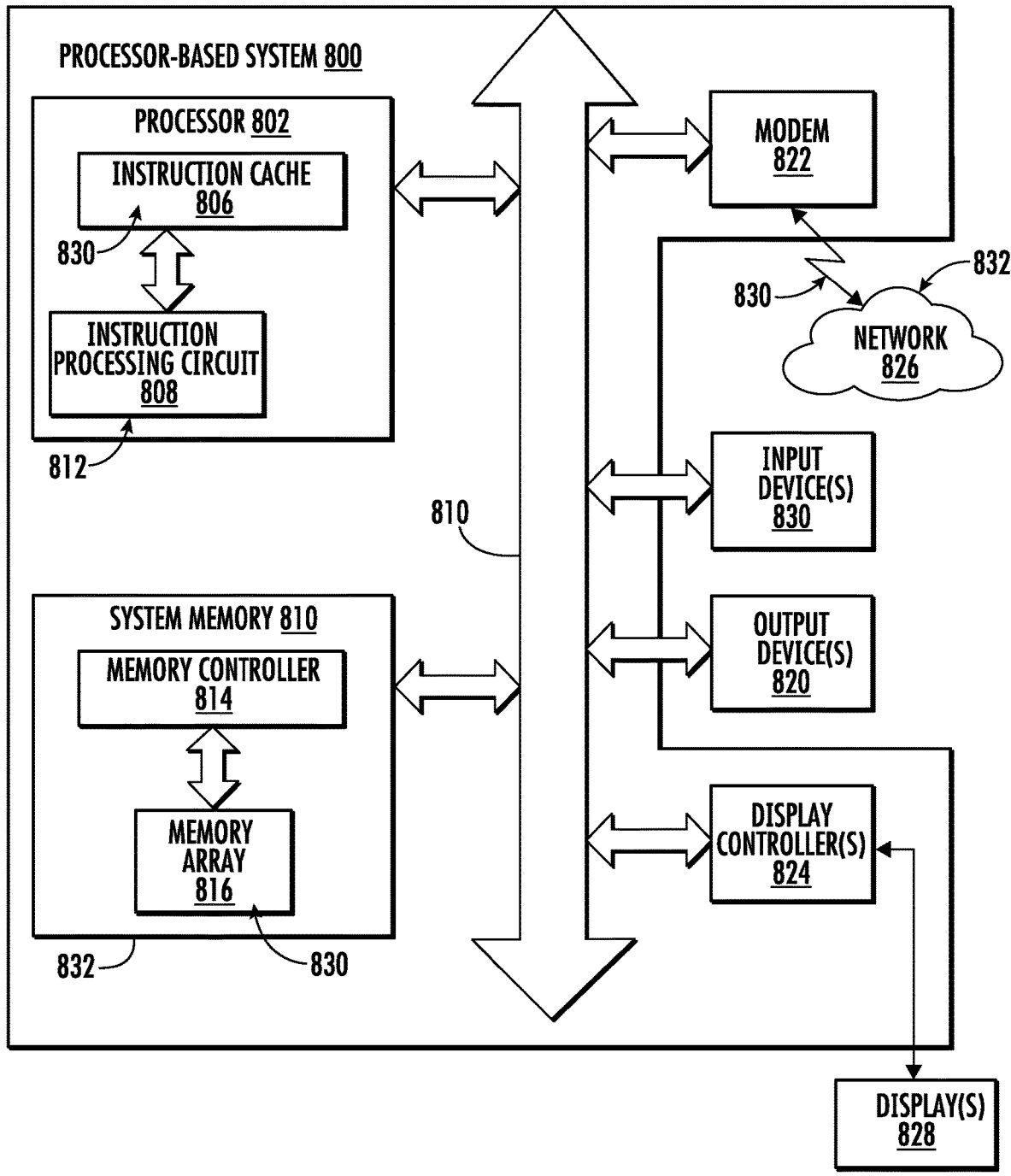

FIGS. 7A and 7B are timing diagrams of signals illustrating operations of the differential PLL in examples of the generated analog signal leading and lagging the reference signal in FIG. 6; and FIG. 8 is a block diagram of an exemplary processor-based system including a plurality of devices coupled to a system bus, wherein one or more integrated circuits (ICs) in the processor-based system include an exemplary PLL circuit employing a hold capacitor to reduce ripple in a control voltage to reduce jitter in a generated analog signal.

DETAILED DESCRIPTION

With reference to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Exemplary aspects disclosed herein include a phase-locked-loop (PLL) circuit employing a hybrid loop filter with sample and hold capacitors for reduced signal jitter. A PLL circuit generates an analog signal in phase-lock with a reference signal at a reference frequency. The PLL circuit includes a charge pump circuit, a loop filter circuit, a feedback divider, and a voltage controlled oscillator (VCO) circuit. The charge pump circuit charges/discharges a sample capacitor of the loop filter circuit to a sample voltage based on a phase difference (timing difference) between the generated analog signal and the reference signal. The loop filter circuit stores the sample voltage as a proportional control voltage in a hold capacitor to reduce or avoid ripple in the control voltage because such ripple creates undesirable frequency variations which accumulate to phase variations (i.e., jitter) in the generated analog signal. The loop filter circuit also provides the sample voltage to a digital integral component circuit that produces an integral control voltage. The VCO circuit generates the analog signal at a frequency that is based on the proportional control voltage on the hold capacitor and based on the integral control voltage from the integral component circuit. In some examples, a PLL circuit including the loop filter circuit with the hold capacitor reduces noise in signals transmitted by a wireless device. In some examples, the loop filter circuit including the hold capacitor generates a single-ended control voltage to the VCO circuit. In some examples, the loop filter circuit including the hold capacitor generates a differential control voltage to the VCO circuit.

Before describing details and operation of exemplary PLL circuits illustrated in FIGS. 3 and 6, examples of conventional PLLs are first described with reference to FIGS. 1 and 2.

Figure 1:
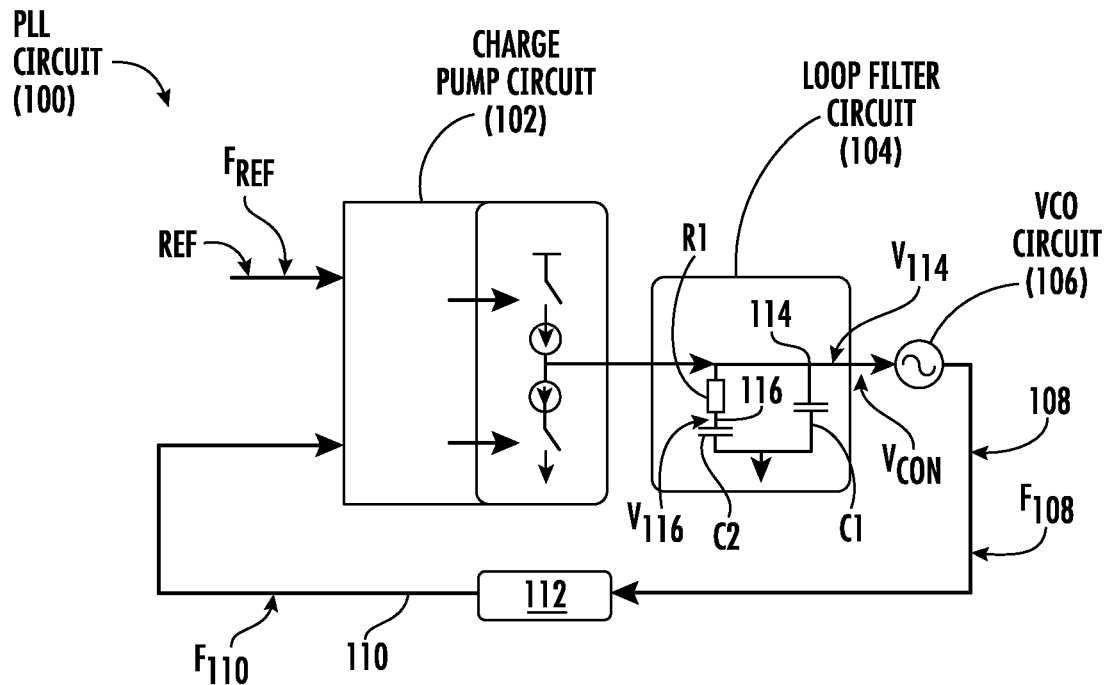
FIG. 1 is a schematic diagram of a conventional phase-locked-loop (PLL) circuit with a single-path loop filter circuit.

FIG. 1 is a schematic diagram of a conventional phase-locked-loop (PLL) circuit 100 with a charge pump circuit 102, a loop filter circuit 104, and a VCO 106. The PLL 100 generates an analog signal 108 that is synchronized to a reference signal REF having a reference frequency $F_{REF}$. The reference frequency $F_{REF}$ may be a target frequency of the analog signal 108 used by a wireless or wireline device (not shown). At PLL "locked" state, an actual frequency $F_{108}$ of the analog signal 108 will be at $F_{REF}$ or a multiple of the reference frequency $F_{REF}$ (N×$F_{REF}$, where N is an integer) and is determined by a control voltage $V_{CON}$ provided to the VCO 106. The control voltage $V_{CON}$ is determined based on a feedback signal 110 that is fed back to the PLL 100 and compared to the reference signal REF. The feedback signal 110 may be the analog signal 108 or the output of a divider circuit 112 that divides the analog signal 108 by the factor N to generate the feedback signal 110 with a frequency $F_{110}=F_{108}/N$. Different analog frequencies $F_{108}$ may be synthesized by the PLL 100 depending on the value N.

The desired frequency $F_{110}$ of the feedback signal 110 is the reference frequency $F_{REF}$. However, the frequency $F_{108}$ of the analog signal 108 may vary, causing the feedback signal 110 to become out-of-phase with the reference signal REF. In other words, a phase of the analog signal 108 may be ahead or behind (i.e., leading or lagging in time) that of the reference signal REF. When this is detected, the control signal $V_{CON}$ provided to the VCO 106 is adjusted to synchronize the phase of the analog signal 108 with the reference signal REF. For example, the frequency $F_{108}$ of the analog signal 108 may be briefly increased to allow the analog signal 108 to catch up to the reference signal REF or the frequency $F_{108}$ of the analog signal 108 may be briefly decreased to allow the analog signal 108 to slow down and allow the reference signal REF to catch up to the analog signal 108. In this regard, the analog signal 108 becomes "locked" with the reference signal REF.

The control signal $V_{CON}$ is generated by the loop filter circuit 104 with input from the charge pump circuit 102. The charge pump circuit 102 is configured to charge a sample node 114 for a period of time determined by the phase difference between the reference signal REF and the feedback signal 110. In this regard, a first capacitor C1 coupled to the sample node 114 is charged to a voltage $V_{114}$ that may be proportional to the phase difference. The sample node 114 is also coupled to a resistor R1 that is in series with a second capacitor C2. As the first capacitor C1 is charged, the second capacitor C2 also begins to charge at a slower rate due to the resistor R1. After the sample node 114 is initially charged to the voltage $V_{114}$, the charge on the capacitor C1 dissipates through the resistor R1, discharging the sample node 114 and further charging a node 116 of the second capacitor C2. If the second capacitor C2 is much larger than the first capacitor C1 in capacitance, changes to the voltage $V_{116}$ occur gradually over multiple cycles, providing an integral component to the control voltage $V_{CON}$. However, making the second capacitor C2 much larger than the first capacitor C1 typically causes the second capacitor C2 to occupy much more area than the first capacitor C1, which increases product costs of integrated circuits (ICs) including the PLL 100.

Figure 2:
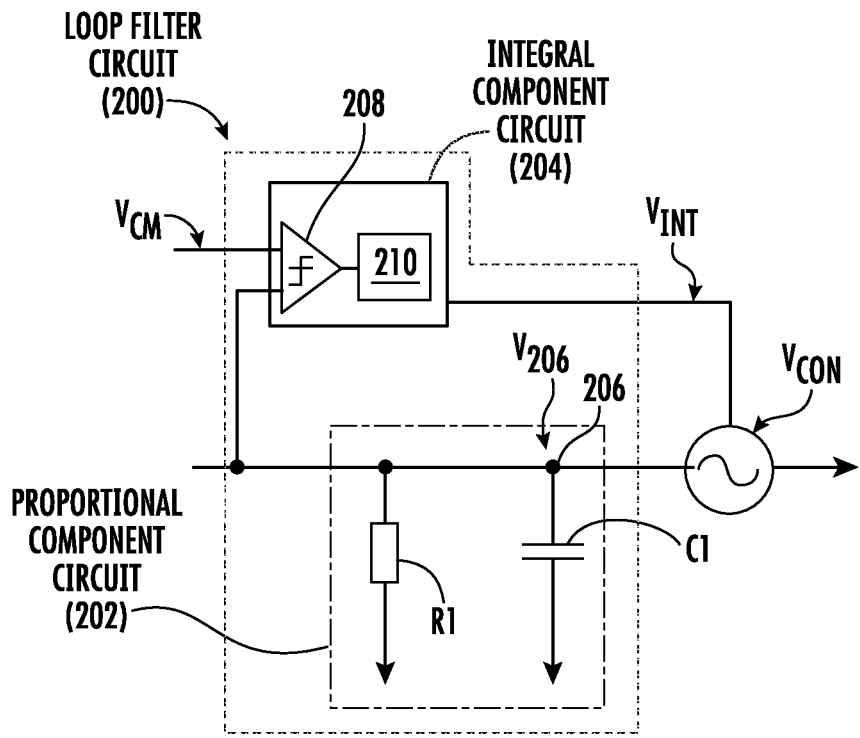
FIG. 2 is a schematic diagram of a conventional loop filter circuit with separate circuits for generating proportional and integral components of control voltages for the VCO circuit.

A solution to the large area occupied by the second capacitor C2 of the PLL 100 is illustrated in the loop filter circuit 200 in FIG. 2, which may be employed to replace the loop filter circuit 104 in FIG. 1. FIG. 2 is a schematic diagram of an improved conventional loop filter circuit 200 with a proportional component circuit 202 separate from an integral component circuit 204. FIG. 2 also includes a VCO, which may be the VCO 106 of FIG. 1 controlled by both of the proportional component circuit 202 and the integral component circuit 204. In FIG. 2, the loop filter circuit 200 controls the frequency $F_{108}$ of the analog signal 108 generated by the VCO 106. In the proportional component circuit 202, a node 206 of the capacitor C1 is charged by a charge pump circuit (not shown) to a voltage $V_{206}$ based on the phase difference, and the voltage $V_{206}$ will dissipate through the resistor R1.

One option, not shown, for the integral component circuit 204 could be a second capacitor C2 reduced in size by a factor K. Such reduced second capacitor C2 could be charged separately from the node 206 with a charge current that is also reduced by the factor K. However, reducing the charge current by the factor K increases, by the factor K, the effects of uncorrelated noise in an integral control voltage $V_{INT}$, adding noise in the control voltage $V_{CON}$. Such noise in the control voltage $V_{CON}$ provided to a VCO circuit degrades the signal quality of the analog signal 108 generated by the VCO circuit.

Instead, the option for the integral component circuit 204 shown in FIG. 2 is a digital solution having a smaller area than the second capacitor C2 in FIG. 1 and avoiding the noise problems of using the second capacitor C2. Details of operation of a digital integral component circuit are beyond the scope of the present disclosure and will be described here only to the extent needed. The integral component circuit 204 is coupled to the node 206 and employs a comparator 208 to compare the voltage $V_{206}$ on the node 206 to an intermediate voltage $V_{CM}$. The intermediate voltage $V_{CM}$ is between a supply voltage (e.g., $V_{DD}$) and a reference voltage (e.g., $V_{SS}$ or $V_{GND}$). A digital computing circuit 210 in the integral component circuit 204 accumulates the results of such comparisons over multiple cycles of the reference signal REF to determine the integral control voltage $V_{INT}$, which is an integral component of the control voltage $V_{CON}$. In this example, the control voltage $V_{CON}$ is determined by a sum of the voltage $V_{206}$ of the node 206 and the integral control voltage $V_{INT}$. The integral component circuit 204 avoids the large area and noise problems of the second capacitor C2 discussed above.

However, in a PLL employing either the second capacitor C2 or the integral component circuit 204 comprising a digital solution, a voltage ripple is caused in the voltage $V_{206}$, which creates a voltage ripple in the control voltage $V_{CON}$. As previously stated, the node 206 of the capacitor C1 is charged to the voltage $V_{206}$ and then discharged through the resistor R1. This creates a corresponding rise and fall in the control voltage $V_{CON}$ because the control voltage $V_{CON}$ is a sum of the voltage $V_{206}$ and the integral control voltage $V_{INT}$. The brief rise and fall in the control voltage $V_{CON}$ in each cycle of the reference signal REF causes a surge and drop off in frequency, which is seen as periodic jitter in an analog signal generated by a VCO. Thus, a PLL including a proportional component circuit with reduced voltage ripple would reduce jitter of signals used in wireless/wireline systems.

Figure 3:
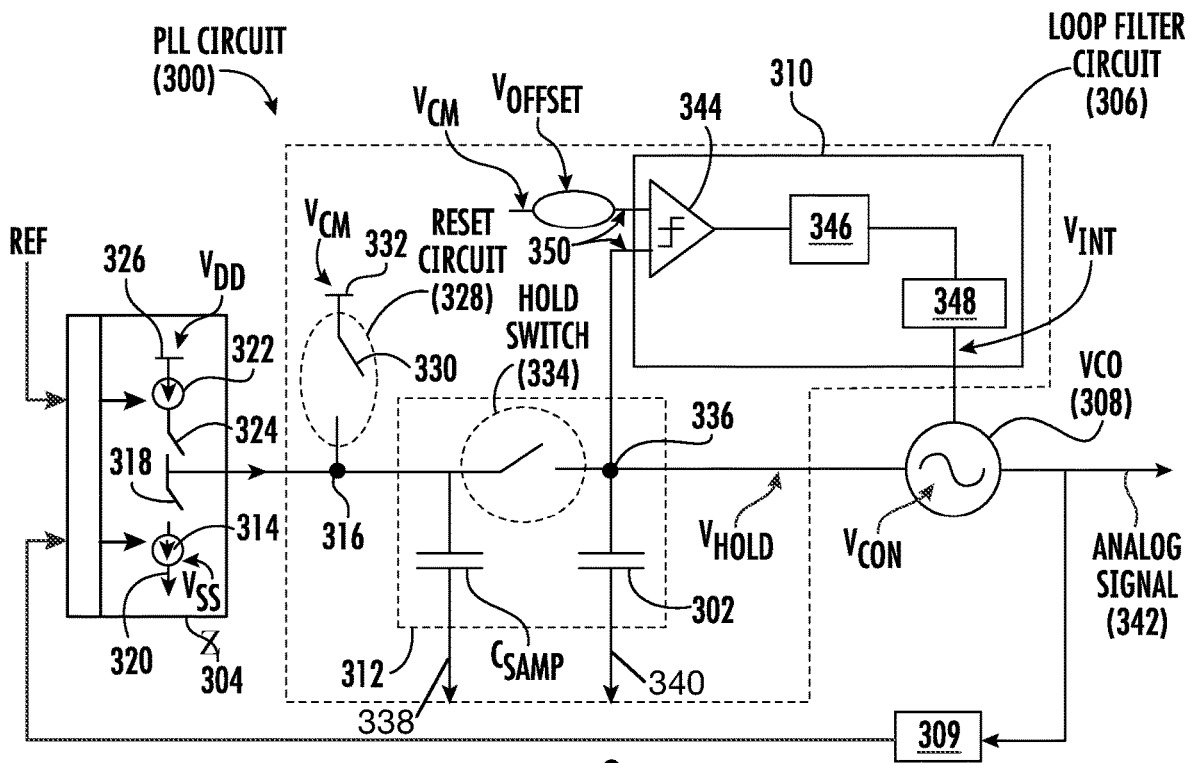
FIG. 3 is a schematic diagram of an exemplary single-ended PLL circuit employing a hold capacitor to reduce ripple in the control voltage provided to the VCO circuit.

In this regard, an exemplary single-ended PLL circuit 300 employing a hold capacitor 302 that reduces ripple in a control voltage $V_{CON}$ is illustrated in a schematic diagram in FIG. 3. Operation of the PLL circuit 300 is described below with reference to the timing diagram 400 in FIG. 4, after the following detailed description of features and components of the PLL circuit 300.

The PLL 300 includes a charge pump circuit 304, a loop filter circuit 306, a VCO 308 (also referred to as VCO circuit 308), and a component divider 309. The loop filter circuit 306 includes integral component circuit 310, which is a digital circuit, and a proportional component circuit 312, which is an analog circuit. Thus, PLL 300 includes a hybrid loop filter circuit 306. The integral component circuit 310 may be the digital solution of the integral component circuit 204 discussed above with reference to FIG. 2. The proportional component circuit 312 includes the hold capacitor 302, without the resistor R1 that dissipates the charge of the capacitor C1 as shown in FIG. 2.

The charge pump circuit 304 includes a first current source 314 coupled to a sample node 316 by a first switch 318. The first current source 314 is further coupled to a reference voltage rail 320 that may supply, for example, a reference voltage $V_{SS}$ or $V_{GND}$ (e.g., ground voltage or 0 volts). The charge pump circuit 304 also includes a second switch 324 coupled to the sample node 316 and to a second current source 322, which is further coupled to a first supply voltage rail 326. The supply voltage rail 326 may supply, for example, a power supply voltage $V_{DD}$ that depends on technology requirements.

The loop filter circuit 306 includes a reset circuit 328 coupled to the sample node 316. The reset circuit 328 includes a reset switch 330 configured to couple the sample node 316 to an intermediate supply voltage rail 332. The intermediate supply voltage rail 332 supplies an intermediate voltage $V_{CM}$ that may be between the power supply voltage $V_{DD}$ and the reference voltage $V_{SS}$. The integral component circuit 310 generates the integral control voltage $V_{INT}$ based on a comparison of the proportional control voltage $V_{HOLD}$ and the intermediate voltage $V_{CM}$ (plus any applied offset voltage $V_{OFFSET}$).

The loop filter circuit 306 also includes a sample capacitor $C_{SAMP}$, the hold capacitor $C_{302}$, and a hold switch 334 coupled to the sample capacitor $C_{SAMP}$ and the hold capacitor $C_{302}$. The sample capacitor $C_{SAMP}$ includes the sample node 316 and the hold capacitor $C_{302}$ comprises a hold node 336. The hold switch 334 is coupled to the sample node 316 of the sample capacitor $C_{SAMP}$ and to the hold node 336 of the hold capacitor $C_{302}$. The sample node 316 is also coupled to the charge pump circuit 304. A second node 338 of the sample capacitor $C_{SAMP}$ and a second node 340 of the hold capacitor $C_{302}$ are coupled to the reference voltage rail 320. The hold node 336 is coupled to the VCO 308. A voltage $V_{HOLD}$ of the hold node 336 is a proportional control voltage provided to the VCO 308 and summed with an integral control voltage $V_{INT}$ from the integral component circuit 310 to determine a frequency $F_{342}$ of an analog signal 342 generated by the VCO 308. The integral control voltage $V_{INT}$ may be generated in the integral component circuit 310 based on the proportional control voltage $V_{HOLD}$ on the hold node 336 and comparisons of the proportional control voltage $V_{HOLD}$ to the intermediate voltage $V_{CM}$. The PLL 300 also includes control circuits (not shown) which may include logic circuits and state machines, for example, to control operation of the charge pump circuit 304, the loop filter circuit 306, and the VCO 308.

As explained in more detail below, the integral component circuit 310 performs a digital integration, which can save a significant amount of chip area by eliminating the second capacitor C2 shown in FIGS. 1 and 2. The integral circuit 310 includes a comparator 344 employed to compare the voltage $V_{HOLD}$ of the hold node 336 to the intermediate voltage $V_{CM}$ on the intermediate supply voltage rail 332. The integral component circuit 310 may include a gain adjusted digital accumulator 346 and a control voltage generation circuit 348, which could include a digital-to-analog converter (DAC) to generate an analog signal indicating $V_{INT}$ or digital logic to generate a multi-bit digital signal indicating the integral control voltage $V_{INT}$. A gain adjusted digital accumulator 344 may digitally shift an accumulator count to increase or decrease responsiveness of the integral component circuit 310. The gain adjusted accumulator 344 is coupled to the comparator 344 to count or accumulate results of comparisons of the state of the voltage $V_{HOLD}$ and the intermediate voltage $V_{CM}$ over a number of cycles of the reference signal REF. As an example, a state of the voltage $V_{HOLD}$ and the intermediate voltage $V_{CM}$ may be compared in each cycle of the reference signal REF. The integral control voltage $V_{INT}$ may be generated based on accumulated states of the control voltage $V_{HOLD}$. In some examples, the integral control voltage $V_{INT}$ may be generated at a value indicating the control voltage $V_{HOLD}$ is greater than the intermediate voltage $V_{CM}$. In some examples, the integral control voltage $V_{INT}$ may be generated at a value indicating the control voltage $V_{HOLD}$ is less than the intermediate voltage $V_{CM}$ or equal to the intermediate voltage $V_{CM}$.

The comparator 344 may be a source of ripple in the integral control voltage $V_{INT}$ due to its input offset voltage $V_{OFFSET}$. The offset voltage $V_{OFFSET}$ is equivalent to a voltage applied to one of the inputs 350 to achieve an indication from the comparator 344 that the voltage $V_{HOLD}$ of the hold node 336 is equal to the intermediate voltage $V_{CM}+V_{OFFSET}$. For the integral component circuit 310 to stabilize the integral control voltage $V_{INT}$, the voltage $V_{HOLD}$ (as well as voltage $V_{316}$) from the proportional component circuit 312 needs to be the intermediate voltage $V_{CM}$ plus the offset voltage $V_{OFFSET}$ but, for reset operation, the voltage on the sample node 316 needs to be the intermediate voltage $V_{CM}$. Thus, the offset voltage $V_{OFFSET}$ of the comparator 344 causes periodic voltage rise and fall on the sample node 316. $V_{HOLD}$, on the other hand, can keep a constant voltage of $V_{CM}$ plus the offset voltage $V_{OFFSET}$ because of the isolation of hold switch 334.

Figure 4:
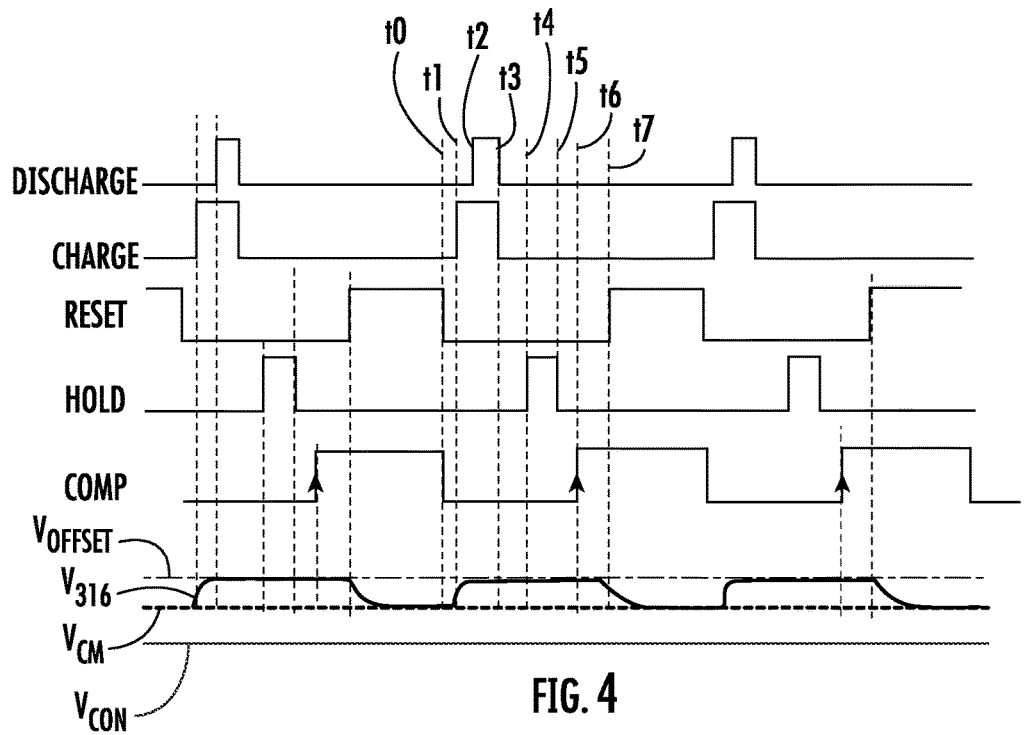
FIG. 4 is a signal timing diagram illustrating generation of an analog signal phase locked with a reference signal in the PLL of FIG. 3.

FIG. 4 is a signal timing diagram 400 provided for reference in a description of operation of the PLL 300 of FIG. 3. The timing diagram 400 includes a RESET signal that controls the reset switch 330. Prior to time t0, the RESET signal is activated to keep the reset switch 330 closed to couple the sample node 316 to the intermediate supply voltage rail 332. Prior to time t0, the first switch 314 and the second switch 322 of the charge pump circuit 304 are open and the hold switch 334 is open. Thus, a voltage $V_{316}$ of the sample node 316 is set to the intermediate voltage $V_{CM}$ in a reset of the PLL circuit 300 prior to time t0. At time t0, the RESET signal is deactivated to open the reset switch 330 to decouple the sample node 316 from the second supply voltage rail 332.

At time t1, the CHARGE signal activates the first switch 324 of the charge pump circuit 304 to couple the sample node 316 to the current source circuit 322. The CHARGE signal may be activated when a phase of the reference signal REF is ahead of a phase of the analog signal 342. The current source circuit 322 charges the sample node 316 to a voltage $V_{316}$. As shown in FIG. 4, the voltage $V_{316}$ is increased from the intermediate voltage $V_{CM}$ by an amount of the offset voltage $V_{OFFSET}$ before the DISCHARGE signal is activated at time t2. The DISCHARGE signal may become active in response to an active phase of the analog signal 342 following an active phase of the reference signal REF. The DISCHARGE signal controls the switch 318 of the charge pump circuit 304 to couple the sample node 316 to the current source circuit 314, which discharges the sample node 316 at a rate corresponding to the charge provided by the current source circuit 322. Thus, the current source circuit 322 and the current source circuit 314 do not further charge or discharge the sample node 316 until time t3, when the CHARGE signal and the DISCHARGE signal are deactivated, at which time the switch 314 and the switch 322 are opened.

At time t4, the HOLD signal is activated to control the hold switch 334 to close in order to couple the sample node 316 to the hold node 336. The HOLD signal remains active until it is deactivated at time t5. During the time the HOLD signal is active, the proportional control voltage $V_{HOLD}$ of the hold node 336 is set to the voltage $V_{316}$ on the sample node 316 by charge sharing. At time t5, when the HOLD signal is deactivated, the hold switch 334 is opened and the voltage $V_{HOLD}$ remains unchanged on the hold node 336. At time t6, the RESET signal is activated to keep the reset switch 330 closed to couple the sample node 316 to the intermediate supply voltage rail 332 again to reset the PLL 300 and the sequence described above is repeated. While the voltage $V_{HOLD}$ on the hold node 336 is stable, the proportional control voltage $V_{HOLD}$ on one of the inputs 350 is compared to the intermediate voltage $V_{CM}$ plus the offset voltage $V_{OFFSET}$ on the other one of the inputs 350 of the comparator 344. The comparison is triggered by a rising edge of the COMP signal at time t6. Control circuits (not shown) of the PLL 300 control activation and deactivation of the DISCHARGE, CHARGE, RESET, HOLD, and COMP signals.

In the above-described operation, the voltage $V_{HOLD}$ of the hold node 336 remains stable when the analog signal 342 is locked in phase with the reference signal REF. Thus, ripple is reduced or avoided in the proportional control voltage $V_{HOLD}$ because the hold node 336 remains stable. As a result, jitter is avoided in an analog signal 342 generated by the VCO circuit 308.

A phase locked state of the PLL 300 occurs when the control voltage $V_{CON}$ remains steady from cycle to cycle. If the comparator 344 determines the proportional control voltage $V_{HOLD}$ is not equal to the sum of the intermediate voltage $V_{CM}$ plus the offset voltage $V_{OFFSET}$ (i.e., $V_{CM}+V_{OFFSET}$), the control voltage $V_{CON}$ is not stabilized.

Figure 5B:
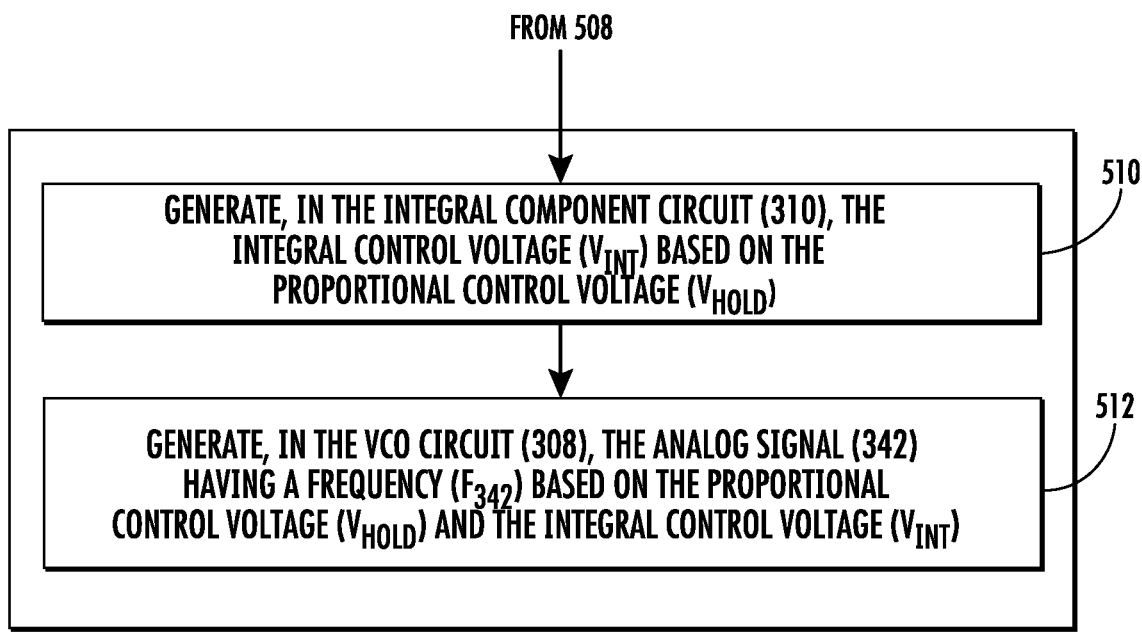

FIGS. 5A and 5B are a flowchart 500 illustrating a method of generating the analog signal 342 in the PLL 300 of FIG. 3. The method includes controlling the PLL circuit 300, the PLL circuit 300 including the voltage controlled oscillator 308, the sampling capacitor $C_{SAMP}$ comprising the sample node 316, the reset circuit 328 coupled to the sample node 316, the charge pump circuit 304 coupled to the sample node 316, the hold capacitor $C_{HOLD}$ comprising the hold node 336, wherein the proportional control voltage $V_{HOLD}$ is a voltage on the hold node 336, the hold switch 334 coupled to the sample node 316 and the hold node 336, and an integral component circuit 310 coupled to the hold node 336, wherein controlling the PLL circuit 300 comprises, in some examples, controlling the reset circuit 328 to couple the sample node 316 to the intermediate supply voltage rail 332 (block 502). In some examples, controlling the PLL circuit 300 further comprises controlling the switch 318 of the charge pump circuit 304 to couple the sample node 316 to a first current source circuit 314 coupled to a reference voltage rail 320 (block 504). In some examples, controlling the PLL circuit 300 further comprises controlling a switch 324 of the charge pump circuit 304 to couple the sample node 316 to a current source circuit 322 coupled to a supply voltage rail 326 (block 506). In some examples, controlling the PLL circuit 300 further comprises controlling the hold switch 334 to couple the sample node 316 to the first hold node 336 (block 508). Controlling the PLL circuit 300 further comprises generating, in the integral component circuit 310, the integral control voltage $V_{INT}$ based on the proportional control voltage $V_{HOLD}$ (block 510). Controlling the PLL circuit 300 also includes generating, in the VCO circuit 308, the analog signal 342 having a frequency $F_{342}$ based on the proportional control voltage $V_{HOLD}$ and the integral control voltage $V_{INT}$ (block 512). The operations described in blocks 502, 504, 506, and 508 are optional and no particular order is required. For example, the operation in block 506 may be performed before the operation in block 504, in some examples.

The switches in the PLL 300 are metal-oxide semiconductor (MOS) field effect transistors (FET) (MOSFET) devices which have non-ideal switching characteristics featured as charge injection and gate voltage feedthrough. Those non-ideal effects may introduce extra ripples besides rise and fall caused by the offset voltage $V_{OFFSET}$ of the comparator 344 described above. A modified differential architecture based on PLL 300 can well solve this issue. FIG. 6 is a schematic diagram of an exemplary differential PLL circuit 600 employing a positive hold capacitor 602P and a negative hold capacitor 602N to provide a differential proportional control voltage $V_{HOLD}$ with reduced ripple. The differential PLL circuit 600 includes a charge pump circuit 608, a loop filter circuit 610, a VCO circuit 612, and a frequency divider circuit 615, which divides the analog signal 614 generated by the VCO circuit 612. The frequency divider circuit 615 is coupled to the VCO circuit 612 and the charge pump circuit 608. The frequency divider circuit 615 is configured to receive the analog signal 612 at a frequency $F_{614}$ and generate a frequency-reduced analog signal at a frequency F/N, where N is an integer. Circuits for determining a phase difference of the analog signal 614 and a reference signal REF are not shown. Also not shown are circuits for controlling the charge pump circuit 608 and the loop filter circuit 610 to operate as shown in the timing diagrams in FIGS. 7A and 7B.

The differential proportional control voltage $V_{HOLD}$ is provided to the VCO circuit 612 as a positive control voltage $V_{POS}$ and a negative control voltage $V_{NEG}$, where the proportional control voltage $V_{HOLD}$ is based on a difference between the positive control voltage $V_{POS}$ and the negative control voltage $V_{NEG}$. Thus, the VCO circuit 612 generates the analog signal 614 at a frequency $F_{614}$ based on the positive control voltage $V_{POS}$, the negative control voltage $V_{NEG}$, and the integral control voltage $V_{INT}$. The positive hold capacitor 602P and a negative hold capacitor 602N are included in a proportional component circuit 616 of the loop filter circuit 610. The loop filter circuit 610 also includes an integral component circuit 618.

The proportional component circuit 616 includes a positive sample capacitor 620P including a sample node 622P coupled to the charge pump circuit 608. The proportional component circuit 616 includes a reset circuit 624P including a reset switch 626P. The reset circuit 624P is coupled to the sample node 622P and to an intermediate supply voltage rail 628. The proportional component circuit 616 includes the positive hold capacitor 602P, which includes a positive hold node 630P. The positive control voltage $V_{POS}$ is a voltage on the positive hold node 630P. The proportional component circuit 616 includes a hold switch 632P coupled to the sample node 622P of the positive sample capacitor 620P and also coupled to the hold node 630P of the positive hold capacitor 602P.

The proportional component circuit 616 includes a negative sample capacitor 620N including a sample node 622N coupled to the charge pump circuit 608. The proportional component circuit 616 includes a reset circuit 624N including a reset switch 626N. The reset circuit 624N is coupled to the sample node 622N and to the intermediate supply voltage rail 628. The proportional component circuit 616 includes the negative hold capacitor 602N, which includes a negative hold node 630N. The negative control voltage $V_{NEG}$ is a voltage on the negative hold node 630N. The proportional component circuit 616 includes a hold switch 632N coupled to the sample node 622N of the negative sample capacitor 620N and also coupled to a hold node 630N of the negative hold capacitor 602N.

The charge pump circuit 608 includes a switch 636P to couple the sample node 622P to a current source circuit 638P, which is further coupled to a reference voltage rail 640. The charge pump circuit 608 includes a switch 642P (complimentary switch to 636P) to couple the current source circuit 638P to the intermediate supply voltage rail 628. In some examples, the switch 642P is optional.

The charge pump circuit 608 includes a switch 636N to couple the sample node 622N to a current source circuit 638N, which is further coupled to the reference voltage rail 640. The charge pump circuit 608 includes a switch 642N (complimentary switch to 636N) to couple the current source circuit 638N to the intermediate supply voltage rail 628. In some examples, the switch 642N is optional. The positive control voltage $V_{POS}$ and the negative control voltage $V_{NEG}$ are provided to inputs 644 of the comparator 606. Rather than comparing a voltage of the proportional component circuit 616 to a fixed voltage (i.e., the intermediate voltage $V_{CM}$) as in the PLL circuit 300 in FIG. 3, the comparator 606 compares the positive control voltage $V_{POS}$ and the negative control voltage $V_{NEG}$, which are each generated by the proportional component circuit 616. Consequently, as explained further below, the ripple provided to the VCO circuit 612 is significantly reduced.

The integral component circuit 618 provides a digital integration of the output of the comparator 606 to avoid the use of a large capacitor. Thus, the loop filter circuit 610 is a hybrid of an analog proportional component circuit 616 and a digital integral component circuit 618. In addition to the comparator 606, the integral component circuit 618 includes a gain-adjusted accumulator circuit 646 and a control voltage generation circuit 648, which may include additional logic circuits as well as, in some examples, analog circuits to generate the control voltage $V_{INT}$, which may be generated as either an analog signal or a digital signal to the VCO circuit 612. The accumulator circuit 646 accumulates (i.e., keeps a count) of the results of comparisons made in the comparator 606 between the states of the positive control voltage $V_{POS}$ and the negative control voltage $V_{NEG}$. Thus, the control voltage $V_{INT}$ is generated based on an accumulation of the states of the control voltage $V_{HOLD}$.

Operation of the differential PLL circuit 600 is explained with reference to FIGS. 6, 7A and 7B. FIGS. 7A and 7B are signal timing diagrams 700A and 700B illustrating operations of the differential PLL circuit 600 in FIG. 6. In both of the timing diagrams 700A and 700B, prior to time t0, the RESET signal is activated to couple the sample nodes 622P and 622N to the intermediate supply voltage rail 628 to reset the sample nodes 622P and 622N to the intermediate voltage $V_{CM}$. During the reset, the sample nodes 622P and 622N are decoupled from the current source 638P and the current source 638N, respectively. The charge pump circuit 608 does not further charge the sample nodes 622P and 622N. Rather, after the RESET, the charge pump circuit 608 is employed to discharge the sample nodes 622P and 622N for respective periods determined by a phase difference between the analog signal 614 and the reference signal REF.

The signal timing diagram 700A is an example in which a phase of the reference signal REF leads the corresponding phase of the analog signal 614. At time t0, the RESET signal is deactivated to open the reset switches 626P and 626N to decouple the sample nodes 622P and 622N from the intermediate voltage $V_{CM}$. Due to the MOSFET issues described above, both the positive control voltage $V_{POS}$ and the negative control voltage $V_{NEG}$ experience a voltage drop (ripple) and then recover. In this example, a POS signal is activated to control the switch 636P to couple the sample node 622P to the current source 638P at time t1 to begin discharging the sample capacitor 620P. A NEG signal is activated at time t2 to control the switch 636N to couple the sample node 622N to the current source 638N to begin discharging the sample capacitor 620N. At time t3, both of the POS and NEG signals are deactivated to stop the discharging of the sample capacitors 620P and 620N. Due to the different discharge times, the sample capacitor 620P may have a lower voltage than the sample capacitor 620N. At time t4, the HOLD signal is activated to control the hold switch 632P to be closed to couple the hold node 630P to the sample node 622P. The HOLD signal also controls the hold switch 632N to couple the hold node 630N to the sample node 622N. While the HOLD signal remains active, a voltage on the sample capacitors 620P and 620N are transferred to the hold capacitors 602P and 602N, respectively. As a result, the positive control voltage $V_{POS}$ and the negative control voltage $V_{NEG}$ rise until HOLD signal drops. The positive control voltage $V_{POS}$ and the negative control voltage $V_{NEG}$ again see a voltage surge or ripple when the PLL 600 is again RESET. The switches 642P and 642N receive control signals that are the inverse of control signals for the switches 636P and 636N, being activated by the POS_N and NEG_N signals, respectively. The switches 642P and 642N are provided optionally to maintain a power source to the current sources 638P and 638N to avoid delays due to the need for restarting the current sources 638P and 638N each time the switches 636P and 636N are activated.

As noted above, the positive control voltage $V_{POS}$ and the negative control voltage $V_{NEG}$ rise and fall in response to transitions of control signals, such as the RESET and HOLD signals. Thus, ripple occurs in the positive control voltage $V_{POS}$ and in the negative control voltage $V_{NEG}$. However, because a similar ripple is occurring at the same time in both the positive control voltage $V_{POS}$ and the negative control voltage $V_{NEG}$, there is little to no ripple in the differential control voltage $V_{HOLD}$ between the positive control voltage $V_{POS}$ and the negative control voltage $V_{NEG}$. Thus, with the proportional component circuit 616, which is an analog circuit, coupled to the integral component circuit 618, which is a digital logic circuit, the PLL circuit 600 with differential proportional filter path in FIG. 6 is able to provide a control voltage $V_{HOLD}$ with reduced ripple, allowing the VCO circuit 612 to generate the analog signal 614 with reduced jitter compared to the single-ended PLL circuit 300 in FIG. 3.

The timing diagram 700B is an example in which a phase of the reference signal REF lags behind the corresponding phase of the analog signal 614. In this example, the NEG signal is activated first (at time t1) after the RESET signal is deactivated to begin discharging the sample capacitor 620N. The POS signal is then activated at time t2 to begin discharging the sample capacitor 620P. At time t3, both of the POS and NEG signals are deactivated to stop the discharging of the sample capacitors 620P and 620N. Due to the different discharge times, the sample capacitor 620N would have a lower voltage than the sample capacitor 620N.

In the example in the timing diagram 700A, the voltage $V_{POS}$ provided to the comparator 606 and to the VCO circuit 612 is less than the voltage $V_{NEG}$. In the example in the timing diagram 700B, the voltage $V_{POS}$ provided to the comparator 606 and to the VCO circuit 612 is greater than the voltage $V_{NEG}$. Thus, in the example in FIG. 7A, the VCO circuit 612 would be controlled to advance the frequency of the analog signal 614 to catch up to and phase lock with the reference signal REF. In the example in FIG. 7B, the VCO circuit 612 would be controlled to reduce the frequency of the analog signal 614 to allow the reference signal REF to catch up to the analog signal 614. In both examples of FIGS. 7A and 7B, the hold capacitors 602P and 602N provide stable voltages, $V_{NEG}$ and $V_{POS}$, with reduced ripple, to reduce jitter in the analog signal 614 generated by the PLL circuit 600.

FIG. 8 is a block diagram of an exemplary processor-based system 800 that includes a processor 802 (e.g., a microprocessor) that includes an instruction processing circuit 804. The processor-based system 800 may be a circuit or circuits included in an electronic board card, such as a printed circuit board (PCB), a server, a personal computer, a desktop computer, a laptop computer, a personal digital assistant (PDA), a computing pad, a mobile device, or any other device, and may represent, for example, a server, or a user's computer. In this example, the processor-based system 800 includes the processor 802. The processor 802 represents one or more general-purpose processing circuits, such as a microprocessor, central processing unit, or the like. More particularly, the processor 802 may be an EDGE instruction set microprocessor or other processor implementing an instruction set that supports explicit consumer naming for communicating produced values resulting from execution of producer instructions. The processor 802 is configured to execute processing logic in instructions for performing the operations and steps discussed herein. In this example, the processor 802 includes an instruction cache 806 for temporary, fast access memory storage of instructions accessible by the instruction processing circuit 804. Fetched or prefetched instructions from a memory, such as a main memory 808, over a system bus 810, are stored in the instruction cache 806. Data may be stored in a cache memory 812 coupled to the system bus 810 for low-latency access by the processor 802. The instruction processing circuit 804 is configured to process instructions fetched into the instruction cache 806 and process the instructions for execution.

The processor 802 and the main memory 808 are coupled to the system bus 810 and can intercouple peripheral devices included in the processor-based system 800. As is well known, the processor 802 communicates with these other devices by exchanging address, control, and data information over the system bus 810. For example, the processor 802 can communicate bus transaction requests to a memory controller 814 in the main memory 808 as an example of a slave device. Although not illustrated in FIG. 8, multiple system buses 810 could be provided; wherein each system bus 810 constitutes a different fabric. In this example, the memory controller 814 is configured to provide memory access requests to a memory array 816 in the main memory 808. The memory array 816 is comprised of an array of storage bit cells for storing data. The main memory 808 may be a read-only memory (ROM), flash memory, dynamic random-access memory (DRAM), such as synchronous DRAM (SDRAM), etc., and/or static memory (e.g., flash memory, SRAM, etc.), as non-limiting examples.

Other devices can be connected to the system bus 810. As illustrated in FIG. 8, these devices can include the main memory 808, one or more input device(s) 818, one or more output device(s) 820, a modem 822, and one or more display controllers 824, as examples. The input device(s) 818 can include any type of input device, including but not limited to input keys, switches, voice processors, etc. The output device(s) 820 can include any type of output device, including but not limited to audio, video, other visual indicators, etc. The modem 822 can be any device configured to allow exchange of data to and from a network 826. The network 826 can be any type of network, including but not limited to a wired or wireless network, a private or public network, a local area network (LAN), a wireless local area network (WLAN), a wide area network (WAN), a BLUETOOTH™ network, and the Internet. The modem 822 can be configured to support any type of communications protocol desired. The processor 802 may also be configured to access the display controller(s) 824 over the system bus 810 to control information sent to one or more displays 828. The display(s) 828 can include any type of display, including but not limited to a cathode ray tube (CRT), a liquid crystal display (LCD), a plasma display, etc.

The processor-based system 800 in FIG. 8 may include a set of instructions 830 to be executed by the processor 802 for any application desired according to the instructions. The instructions 830 may be stored in the main memory 808, processor 802, and/or instruction cache 806 as examples of a non-transitory computer-readable medium 832. The instructions 830 may also reside, completely or at least partially, within the main memory 808 and/or within the processor 802 during their execution. The instructions 830 may further be transmitted or received over the network 826 via the modem 822, such that the network 826 includes computer-readable medium 832.

Any of the circuits in the processor-based system 800, and in particular the modem 822 and the output devices 820, may include a PLL circuit 300 as shown in FIG. 3 or a PLL circuit 600 as shown in FIG. 6 with a hold capacitor for reducing ripple in a control voltage to reduce jitter in a generated analog signal.

While the computer-readable medium 832 is shown in an exemplary embodiment to be a single medium, the term "computer-readable medium" should be taken to include a single medium or multiple media (e.g., a centralized or distributed database and/or associated caches and servers) that store the one or more sets of instructions. The term "computer-readable medium" shall also be taken to include any medium that is capable of storing, encoding, or carrying a set of instructions for execution by the processing device and that causes the processing device to perform any one or more of the methodologies of the embodiments disclosed herein. The term "computer-readable medium" shall accordingly be taken to include, but not be limited to, solid-state memories, optical medium, and magnetic medium.

The embodiments disclosed herein include various steps. The steps of the embodiments disclosed herein may be formed by hardware components or may be embodied in machine-executable instructions, which may be used to cause a general-purpose or special-purpose processor programmed with the instructions to perform the steps. Alternatively, the steps may be performed by a combination of hardware and software.

The embodiments disclosed herein may be provided as a computer program product or software that may include a machine-readable medium (or computer-readable medium) having stored thereon instructions, which may be used to program a computer system (or other electronic devices) to perform a process according to the embodiments disclosed herein. A machine-readable medium includes any mechanism for storing or transmitting information in a form readable by a machine (e.g., a computer). For example, a machine-readable medium includes a machine-readable storage medium (e.g., ROM, random access memory ("RAM"), a magnetic disk storage medium, an optical storage medium, flash memory devices, etc.); and the like.

Unless specifically stated otherwise and as apparent from the previous discussion, it is appreciated that throughout the description, discussions utilizing terms such as "processing," "computing," "determining," "displaying," or the like, refer to the action and processes of a computer system, or similar electronic computing device, that manipulates and transforms data and memories represented as physical (electronic) quantities within the computer system's registers into other data similarly represented as physical quantities within the computer system memories or registers or other such information storage, transmission, or display devices.

The algorithms and displays presented herein are not inherently related to any particular computer or other apparatus. Various systems may be used with programs in accordance with the teachings herein, or it may prove convenient to construct more specialized apparatuses to perform the required method steps. The required structure for a variety of these systems will appear from the description above. In addition, the embodiments described herein are not described with reference to any particular programming language. It will be appreciated that a variety of programming languages may be used to implement the teachings of the embodiments as described herein.

Those of skill in the art will further appreciate that the various illustrative logical blocks, modules, circuits, and algorithms described in connection with the embodiments disclosed herein may be implemented as electronic hardware, instructions stored in memory or in another computer-readable medium and executed by a processor or other processing device, or combinations of both. The components of the distributed antenna systems described herein may be employed in any circuit, hardware component, integrated circuit (IC), or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends on the particular application, design choices, and/or design constraints imposed on the overall system. Skilled artisans may implement the described functionality in varying ways for each particular application, but such implementation decisions should not be interpreted as causing a departure from the scope of the present embodiments.

The various illustrative logical blocks, modules, and circuits described in connection with the embodiments disclosed herein may be implemented or performed with a processor, a Digital Signal Processor (DSP), an Application Specific Integrated Circuit (ASIC), a Field Programmable Gate Array (FPGA), or other programmable logic device, a discrete gate or transistor logic, discrete hardware components, or any combination thereof designed to perform the functions described herein. Furthermore, a controller may be a processor. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The embodiments disclosed herein may be embodied in hardware and in instructions that are stored in hardware and may reside, for example, in RAM, flash memory, ROM, Electrically Programmable ROM (EPROM), Electrically Erasable Programmable ROM (EEPROM), registers, a hard disk, a removable disk, a CD-ROM, or any other form of computer-readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary embodiments herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary embodiments may be combined. Those of skill in the art will also understand that information and signals may be represented using any of a variety of technologies and techniques. For example, data, instructions, commands, information, signals, bits, symbols, and chips, that may be referenced throughout the above description may be represented by voltages, currents, electromagnetic waves, magnetic fields, or particles, optical fields or particles, or any combination thereof.

Unless otherwise expressly stated, it is in no way intended that any method set forth herein be construed as requiring that its steps be performed in a specific order. Accordingly, where a method claim does not actually recite an order to be followed by its steps, or it is not otherwise specifically stated in the claims or descriptions that the steps are to be limited to a specific order, it is in no way intended that any particular order be inferred.

It will be apparent to those skilled in the art that various modifications and variations can be made without departing from the spirit or scope of the invention. Since modifications, combinations, sub-combinations, and variations of the disclosed embodiments incorporating the spirit and substance of the invention may occur to persons skilled in the art, the invention should be construed to include everything within the scope of the appended claims and their equivalents.

What is claimed is:

1. A phase-locked loop (PLL) circuit comprising:
    a voltage controlled oscillator (VCO) circuit configured to generate an analog signal, wherein a frequency of the analog signal is based on a first control voltage and a second control voltage;
    a charge pump circuit; and
    a loop filter comprising:
        a first sampling capacitor comprising a first sample node coupled to the charge pump circuit;
        a reset circuit coupled to the sample node;
        a first hold capacitor comprising a first hold node, wherein the first control voltage comprises a voltage on the first hold node;
        a hold switch coupled to the first sample node and the first hold node; and
        an integral component circuit comprising:
            a comparator coupled to the first hold node; and
            a digital accumulator coupled to a comparator output of the comparator;
        wherein the second control voltage is generated based on accumulated states of the first control voltage.

2. The PLL circuit of claim 1, wherein:
    the first sampling capacitor is further coupled to a reference voltage rail; and
    the first hold capacitor is further coupled to the reference voltage rail.

3. The PLL circuit of claim 1, the reset circuit comprising a reset switch configured to couple the sample node to a first supply voltage rail.

4. The PLL circuit of claim 1, the charge pump circuit comprising a first switch coupled to the sample node and a first current source, the first current source coupled to a reference voltage rail.

5. The PLL circuit of claim 4, the charge pump circuit further comprising a second switch coupled to the sample node and a second current source, the second current source coupled to a second supply voltage rail.

6. The PLL circuit of claim 1, further comprising a frequency divider circuit coupled to the VCO circuit and the charge pump circuit, the frequency divider circuit configured to receive the analog signal at a frequency F and generate a frequency-reduced analog signal at a frequency F/N, where N is an integer.

7. The PLL circuit of claim 1, the integral component circuit comprising the comparator coupled to a first supply voltage rail, the integral component circuit further configured to:
    compare the first control voltage to a first supply voltage on the first supply voltage rail; and
    generate the second control voltage based on the accumulated comparison result.

8. The PLL circuit of claim 1, further comprising:
    a second sampling capacitor comprising a second sample node coupled to the charge pump circuit;
    a second reset circuit coupled to the second sample node;
    a second hold capacitor comprising a second hold node, wherein a third control voltage comprises a voltage on the second hold node; and
    a second hold switch coupled to the sample node and the hold node;
    wherein:
        the frequency of the analog signal generated by the VCO circuit is further based on the third control voltage.

9. The PLL circuit of claim 8, wherein:
    the second sampling capacitor is further coupled to a reference voltage rail; and
    the second hold capacitor is further coupled to the reference voltage rail.

10. The PLL circuit of claim 8, wherein:
    the reset circuit comprises a reset switch configured to couple the sample node to a first supply voltage rail; and
    the second reset circuit comprises a second reset switch configured to couple the second sample node to the first supply voltage rail.

11. The PLL circuit of claim 8, wherein the charge pump circuit comprises:
    a first switch coupled to the first sample node and a first current source, the first current source coupled to a reference voltage rail; and
    a second switch coupled to the second sample node and a second current source, the second current source coupled to the reference voltage rail.

12. The PLL circuit of claim 11, wherein the charge pump circuit further comprises:
   a third switch coupled to a first voltage supply rail and the first current source; and
   a fourth switch coupled to the first voltage supply rail and the second current source.

13. The PLL circuit of claim 8, the integral component circuit comprising a comparator coupled to the first hold node and the second hold node, the integral component circuit further configured to:
   compare the first control voltage to the third control voltage; and
   generate the second control voltage based on the comparison.

14. A method of generating an analog signal in a phase-locked loop (PLL) circuit, the method comprising:
   controlling the PLL circuit, the PLL circuit comprising:
      a voltage controlled oscillator (VCO) circuit;
      a first sampling capacitor comprising a sample node;
      a reset circuit coupled to the sample node;
      a charge pump circuit coupled to the sample node;
      a first hold capacitor comprising a hold node, wherein a first control voltage comprises a voltage on the hold node;
      a hold switch coupled to the sample node and the hold node; and
      an integral component circuit coupled to the hold node,
   wherein the controlling the PLL circuit comprises:
      comparing the first control voltage to a reference voltage;
      accumulating results of the comparing;
      generating, in the integral component circuit, a second control voltage based on the results accumulated; and
      generating, in the VCO circuit, an analog signal having a frequency based on the first control voltage and the second control voltage.

15. The method of claim 14, wherein controlling the PLL circuit further comprises controlling the reset circuit to couple the sample node to a first supply voltage rail.

16. The method of claim 15, wherein controlling the PLL circuit further comprises controlling the hold switch to couple the sample node to the first hold node.

17. The method of claim 14, wherein controlling the PLL circuit further comprises controlling a first switch of the charge pump circuit to couple the sample node to a first current source circuit coupled to a reference voltage rail.

18. The method of claim 17, wherein controlling the PLL circuit further comprises controlling a second switch of the charge pump circuit to couple the sample node to a second current source circuit coupled to a supply voltage rail.

19. The method of claim 14, wherein the PLL circuit further comprises:
   a second sampling capacitor comprising a second sample node coupled to the charge pump circuit;
   a second reset circuit coupled to the second sample node;
   a second hold capacitor comprising a second hold node, wherein a third control voltage comprises a voltage on the second hold node; and
   a second hold switch coupled to the second sample node and the second hold node controlling the PLL circuit further comprises:
      controlling the reset circuit to couple the sample node to a first supply voltage rail; and
      controlling the second reset circuit to couple the second sample node to the first supply voltage rail.

20. The method of claim 19, wherein controlling the PLL circuit further comprises:
   controlling a first switch of the charge pump circuit to couple the first sample node to a first current supply circuit; and
   controlling a second switch of the charge pump circuit to couple the second sample node to a second current supply circuit.

21. The method of claim 19, wherein controlling the PLL circuit further comprises
   controlling the hold switch to couple the sample node to the first hold node; and
controlling the second hold switch to couple the second sample node to the second hold node.

* * * * *